Sept. 10, 1974 R. H. DENNARD ET AL 3,834,959

PROCESS FOR THE FORMATION OF SELF-ALIGNED SILICON AND ALUMINUM GATES

Filed June 30, 1972 3 Sheets-Sheet 1

Sept. 10, 1974

R. H. DENNARD ET AL 3,834,959

PROCESS FOR THE FORMATION OF SELF-ALIGNED SILICON AND ALUMINUM GATES

Filed June 30, 1972

3 Sheets-Sheet 2

United States Patent Office 3,834,959
Patented Sept. 10, 1974

3,834,959

PROCESS FOR THE FORMATION OF SELF-ALIGNED SILICON AND ALUMINUM GATES

Robert H. Dennard, Croton-on-Hudson, and Dominic P. Spampinato, Ozone Park, N.Y., assignors to International Business Machines Corporation, Armonk, N.Y.

Filed June 30, 1972, Ser. No. 267,879
Int. Cl. H01l 7/50
U.S. Cl. 156—11 22 Claims

ABSTRACT OF THE DISCLOSURE

A process for the simultaneous formation of self-aligned silicon gates and aluminum gates having self-aligned channel regions on the same wafer is disclosed. Basically, the process consists of the deposition of successive layers of silicon nitride and polycrystalline silicon over thick and thin silicon dioxide regions which are disposed on the surface of a semiconductor wafer. Polysilicon gates are delineated in the thin oxide regions. Subsequently, a chemically vapor deposited silicon dioxide layer is formed over the surface of the exposed silicon nitride layer and over the polycrystalline silicon gate regions. At this point, the CVD oxide is delineated to form an oxide mask which will permit the removal of silicon nitride down to the thin oxide at certain regions where diffusion windows are to be formed in exposed thin oxide regions which are subsequently removed by a dip etch. While the exposed thin oxide regions are masked by either silicon nitride portions or polycrystalline silicon gate regions, the masking regions of CVD oxide which protected the silicon nitride layer are simultaneously removed by the dip etch which opens the diffusion windows in the thin oxide regions. After a diffusion step which includes deposition of a phosphorous dopant in the diffusion windows from the vaporous phase and a drive-in step, a thermal oxidation step is carried out which covers the diffused window regions and the polysilicon gates and thick oxide regions leaving the exposed nitride portions unaffected. In a subsequent masking step, diffusion contact windows and silicon gates contact windows are opened. Then, metallization is deposited everywhere and delineated to form metal gates and contacts to both diffusions and silicon gates. Metal is delineated and formed in each of the exposed silicon nitride regions one of which is a self-aligned channel region for a metal gate field-effect transistor. Other metal gates for a charge coupled device are positioned by virtue of the presence of adjacent polysilicon gates and are insulated from the substrate by a thin oxide and nitride layer and from the silicon gates by a layer of thermally grown silicon dioxide on the surface of the silicon gates. The resulting structure includes a metal gate field-effect transistor, a self-aligned silicon gate field-effect transistor, and a charge coupled device on the same wafer. By using an additional masking step over that required for the formation of silicon self-aligned gates alone, metal gates which are either self-aligned by virtue of adjacent polysilicon gates or by virtue of the presence of a self-aligned channel are thus obtained. In addition, a random access charge coupled device which incorporates a metal transfer gate and a polysilicon storage plate is also disclosed. The structure results from the above described fabrication process and is structurally unique in that the metal gate is disposed immediately adjacent to a diffusion region which itself is disposed under a thick oxide layer. In addition, the polycrystalline silicon storage plate is spaced from the metal gate by a layer of thermally grown silicon dioxide.

BACKGROUND OF THE INVENTION

Field of the Invention

This invention generally relates to semiconductor device fabrication processes and to structural arrangements which result from such processes. More specifically it relates to a fabrication process which permits the formation of polycrystalline silicon self-aligned gate and self-aligned channels for metal gate devices by adding a deposition, masking and etching step to what is essentially a prior art process for the formation of self-aligned silicon gates. The deposition step takes place after the delineation of polycrystalline silicon gate areas in thin oxide channel regions and causes a chemically vapor deposited silicon dioxide layer to be deposited on a silicon nitride layer everywhere except where the silicon nitride layer is masked by the delineated polysilicon gates. The chemically vapor deposited oxide is then delineated using a photolithographic masking technique to form an oxide mask for protecting silicon nitride regions during a subsequent silicon nitride etching step. After the silicon nitride has been etched, its oxide mask and thin oxide in the desired diffusion windows are simultaneously removed in an oxide etching step. The formation of diffused regions in the semiconductor wafer and subsequent formation of diffusion contacts and metal gates is carried out by prior art diffusion, metallization and delineation steps but, it should be appreciated that the presence of the exposed nitride regions results in unique structures. The fabrication provides three different structures on the same wafer and includes metal gates, field-effect transistors having the gate thereof disposed in self-aligned channel regions, self-aligned silicon gate field-effect transistors and self-aligned metal and silicon gate charge coupled devices.

Description of the Prior Art

An article entitled "Silicon Gate Technology" by L. L. Vadasz, E. S. Grove, T. A. Rowe, and G. E. Moore, published in *IEEE Spectrum,* in October *1969,* pp. 28–35, shows a fabrication process for the formation of polycrystalline silicon gates which are self-aligned over the channel region of a field-effect transistor. The fabrication process includes the formation of a thin oxide region in a thick oxide layer which is disposed on the surface of a semiconductor wafer. Silicon nitride is then deposited over the thick and thin oxide regions. Subsequently, a layer of polycrystalline silicon is deposited on the silicon nitride layer and delineated in a masking procedure to form a self-aligned polycrystalline silicon gate. In this process, both the silicon nitride and the thin oxide are removed everywhere except under the self-aligned polysilicon gate and diffusions are introduced into the base silicon regions. Subsequently, a layer of silicon dioxide is deposited over the entire surface covering both the diffusion windows and the polycrystalline silicon gate. Contact windows to the diffusion regions are then delineated and the structure is metallized. In a final step, the metallization is delineated. The resulting structure is a self-aligned silicon gate field-effect transistor. Up to the point where the polycrystalline silicon gate regions are formed, the process of the present application and that of the above-mentioned publication are identical.

The process of the present application becomes different at this point. The point of departure occurs when the etching of the pattern defining the polysilicon gate is carried out only through the polysilicon layer, leaving the nitride layer intact. At this point, another masking step is used to delineate those areas where nitride is to be left. A resist mask alone or a delineated vapor deposited oxide layer can be used as a mask against selected areas of nitride.

Polysilicon areas need not be covered by resist except in places adjacent to where nitride is to be left because an etchant can be chosen for the nitride layer which will not attack the polysilicon. Following the nitride etch, a dip etch is used to remove the thin oxide where it is not protected by nitride or polysilicon and also to remove all oxides on top of the nitride and polysilicon areas. A diffusion step then forms source and drain electrodes in the silicon wafer and dopes the polysilicon areas. The nitride layer prevents diffusion into the underlying oxide and also prevents growth of oxide during a subsequent thermal oxidation which establishes an insulating layer on the diffusion areas and on the polysilicon areas. Finally, contact holes are etched in desired regions and contact and gate metallizations are delineated. Thus, while all of the individual steps in the fabrication of the self-aligned silicon gate and aluminum gate regions are known, the interposition of an additional masking step after a chemical vapor deposition step at a critical juncture permits the formation of different devices on the same wafer providing a diversity and flexibility heretofore not obtainable in the semiconductor fabrication art. French Pat. 2,118,944, filing date Dec. 20, 1971, U.S. priority Dec. 21, 1970, Ser. No. 99,944 is typical of processes wherein the additional masking step of the present invention to protect selected nitride areas was not utilized.

SUMMARY OF THE INVENTION

The method of the present invention, in its broadest aspect, relates to a fabrication process wherein a semiconductor wafer has a plurality of thin insulating material regions formed in a thick layer of the same insulating material and in which the thick and thin regions are covered with a layer of insulating material different from the first-mentioned insulating and a layer of semiconductor and comprises the steps of forming in certain of said different insulation covered thin insulating material regions at least a single delineated semiconductor region. The process then includes the step of forming in certain other of the different insulation covered thin insulating regions and adjacent certain of said at least a single delineated semiconductor region masking regions. Using the masking regions which may be formed from photoresist or chemically vapor deposited oxide the different insulation is etched to remove it everywhere except under the polycrystalline regions and under the masking regions to provide a plurality of exposed thin insulating material regions. Finally, the exposed thin insulating material regions and deposited oxide masking regions, if used, are etched to provide a plurality of exposed semiconductor surface regions and a plurality of exposed different insulation regions; the different insulation and the delineated semiconductor regions masking other semiconductor surface regions.

In accordance with more specific aspects of the present invention, the process further includes the step of diffusing a dopant into the exposed semiconductor surface regions and into the delineated semiconductor regions to form doped areas in the semiconductor and to render the delineated semiconductor regions conductive. An insulating layer is then thermally formed on the exposed semiconductor surface regions and on the delineated semiconductor regions. Finally, metal contacts to the doped areas and to the delineated semiconductor regions are formed and metal gates are also formed in the exposed different insulation regions.

In accordance with more specific aspects of the method of the present invention, the thick and thin insulating regions are formed from silicon dioxide, the different insulation is silicon nitride; the delineated semiconductor regions are polycrystalline silicon; the masking regions are either a delineated photoresist or a delineated chemically vapor deposited oxide, preferably, silicon dioxide.

In accordance with the broader aspects of the present invention, a semiconductor device having both polycrystalline silicon and metal self-aligned gates is provided which comprises a semiconductor substrate of first conductivity type having at least three silicon nitride covered thin oxide regions disposed in a thick oxide layer. The device further includes a pair of doped areas of second conductivity type disposed in the substrate adjacent each of the three regions under the thick oxide layer. A metal electrode disposed on a first of the silicon nitride covered thin oxide regions forms with its pair of adjacent diffusions a self-aligned metal gate field effect transistor and a doped polycrystalline electrode disposed on a second of the silicon nitride covered thin oxide areas forms with its pair of adjacent diffusions a self-aligned silicon gate field effect transistor. Finally, the structure includes at least a doped polycrystalline electrode and at least a single metal electrode disposed on a third of said silicon nitride covered thin oxide regions in insulated spaced relationship forming, with its pair of adjacent diffusions a self-aligned metal-silicon gate charge coupled device.

In accordance with still more specific aspects of the present invention, a structure is provided which includes all the above features except that the third silicon nitride covered thin oxide region has associated with it only a single diffusion, a single metal gate and a single polycrystalline silicon gate forming a self-aligned metal-silicon gate charge coupled random access cell.

In accordance with still more specific aspects of the present invention, a semiconductor device having both polycrystalline silicon and metal self-aligned gates is provided and comprises a semiconductor substrate of first conductivity type having a plurality of silicon nitride covered thin oxide regions disposed in a thick oxide layer. Also included is a plurality of doped areas of second conductivity type disposed in the substrate adjacent the silicon nitride covered thin oxide regions under said thick oxide layer and at least one of a metal gate electrode and a silicon gate electrode disposed on said silicon nitride thin oxide regions forming metal and silicon self-aligned gates between pairs of doped areas.

In accordance with still more specific aspects of the present invention, a semiconductor random access cell is provided comprising a semiconductor substrate of one conductivity type having a silicon nitride covered thin oxide region disposed in a region of thick oxide. Also included is at least a portion of a doped silicon electrode disposed on a portion of said silicon nitride covered thin oxide region the surface of said electrode being covered with an oxide. A diffused region of second conductivity type disposed under the thick oxide and spaced from the electrode by another portion of the silicon nitride covered thin oxide is also included. A metal electrode formed over said another portion of said silicon nitride covered thin oxide completes the structure.

The process and devices summarized hereinabove provide a technique for simultaneously forming metal and polysilicon self-aligned gate devices on the same wafer. The resulting devices include metal and self-aligned gate field effect transistors, charge coupled device random access cells and charge coupled device metal gate-polysilicon gate shift register arrangements.

It is therefore an object of the present invention to provide a process which permits the formation of self-aligned metal and polycrystalline silicon gates on the same wafer using only an additional masking step over known prior art techniques.

Another object is to provide a process in which the thickness of thin oxide regions is independent of any regrown oxide thickness. This provides low capacitive coupling between overlying metal interconnections and underlying diffusions or polysilicon regions.

Still another object is to provide semiconductor structures which incorporate both metal gate and self-aligned polycrystalline silicon gate devices on the same semiconductor wafer.

Still another object is to provide a semiconductor device which incorporates metal gate field effect transistors, polycrystalline silicon gate field effect transistors and charge coupled devices on the same semiconductor wafer.

The foregoing and other objects and features of the present invention will be apparent from the following more particular description of preferred embodiments as illustrated in the accompanying drawings.

DESCRIPTION OF A PREFERRED EMBODIMENT

Figure 1:
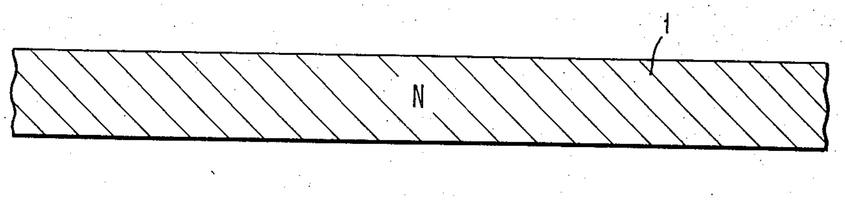
FIGS. 1–13 are cross sections of a semiconductor wafer illustrating various stages of the process for providing a structure having both self-aligned silicon gates and metal gates in self-aligned channels which utilizes only five masking steps.

Referring now to FIG. 1, there is shown therein a cross sectional view of a semiconductor wafer, preferably silicon, which has been doped to be of N-conductivity type by the introduction of an appropriate dopant. Semiconductor wafer 1 after suitable processing has a highly polished surface suitable for the integrated circuit environment and has a typical resistivity of approximately 1 ohm-centimeter.

Figure 2:
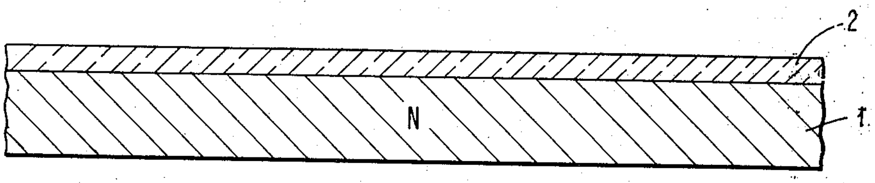

FIG. 2 shows wafer 1 with an overlying layer 2 of thermally grown silicon dioxide. Layer 2 may be formed by heating wafer 1 in an oxidizing atmosphere. One suitable technique for producing layer 2 is to heat wafer 1 to about 1000° C. in steam until a layer of silicon dioxide approximately 6000 Angstroms thick, for example, is obtained.

Figure 3:
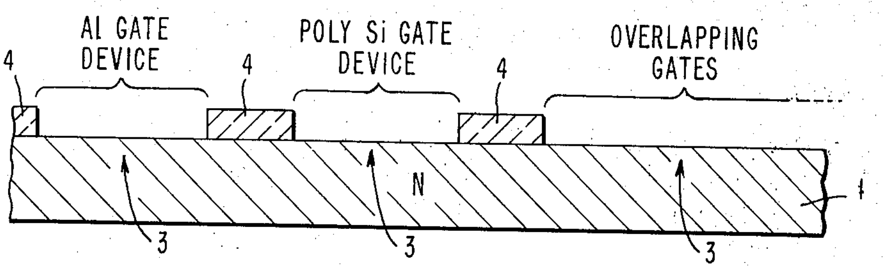

The next step, the results of which are shown in FIG. 3, is to etch a plurality of channel regions 3 in silicon dioxide layer 2. Regions 3 are obtained by using a suitable photoresist applied by conventional methods to wafer 1 and then spinning wafer 1 to insure a uniform coating of the photoresist on its surface. Then, in a first masking step, an image of the pattern is produced by exposing the photoresist to ultraviolet light through a suitable mask. The exposed image is then developed by methods well known to those skilled in the semiconductor fabrication art and the developed areas are removed leaving exposed surface portions of silicon dioxide layer 2. Then, a suitable etchant is employed to dissolve the exposed surface portions of silicon dioxide layer 2. A suitable etchant for silicon dioxide is a buffered solution of hydrofluoric acid and ammonium-fluoride. After etching, channel regions 3 are exposed while other surface portions of wafer 1 remain covered with thick oxide portions 4 of layer 2.

Figure 4:
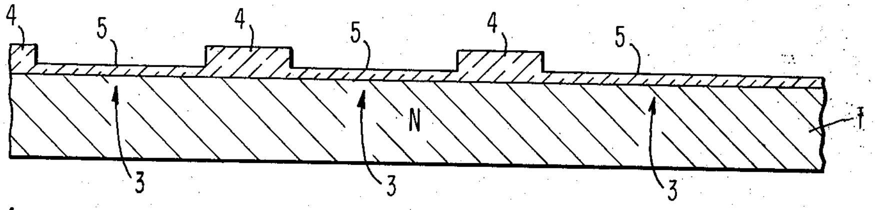

In the next step shown in FIG. 4, thin oxide regions 5 are thermally regrown over channels 3 forming a continuous layer of silicon dioxide which is composed of thick and thin oxide regions 4, 5, respectively. The thermal regrowth of thin oxide regions 5 is carried out in a manner similar to the formation of thermally grown oxide layer 2 as discussed in connection with FIG. 2 hereinabove, except that this oxide is grown in an oxygen ambient, instead of steam. Thin oxide regions 5 are approximately 300 A. thick.

Figure 5:
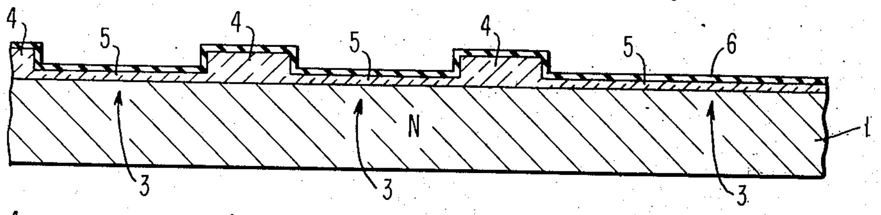

The surfaces of thick oxide regions 4 and thin oxide regions 5 are next covered with a layer 6 of a non-oxidizable material such as silicon nitride as shown in FIG. 5. Layer 6 may be deposited by the pyrolytic decomposition of silane and ammonia at elevated temperature of 1000° C., for example, or by any other techniques well known to those skilled in the semiconductor fabrication arts. The deposition of layer 6 is carried out for a time sufficient to deposit approximately 350 Angstroms.

Figure 6:
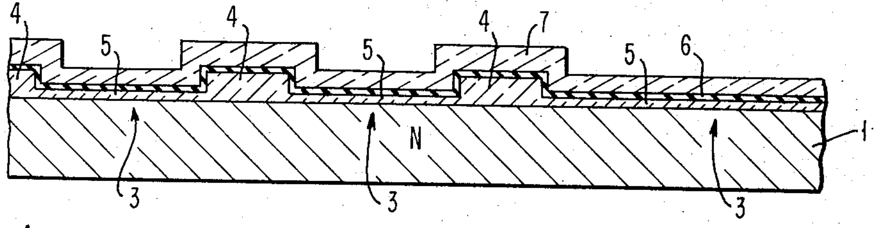

In a subsequent step, as shown in FIG. 6, a layer 7 of polycrystalline silicon is deposited on the surface of silicon nitride layer 6. Polycrystalline layer 7 may be deposited by the pyrolysis of a silicon compound such as silane or by evaporation or sputtering of silicon. When layer 7 is formed by pyrolysis, semiconductor wafer 1 is heated to approximately 1000° C. and exposed to an atmosphere containing the gas $SiH_4$ which, upon decomposition, forms polycrystalline layer 7 over silicon nitride layer 6. Because silicon nitride layer 6 does not permit the formation of single crystal silicon, layer 7 is polycrystalline in nature. However, as far as the final results are concerned, layer 7 could equally well be polycrystalline silicon or single crystal silicon. Layer 7 is approximately 8000 A. thick.

Figure 7:
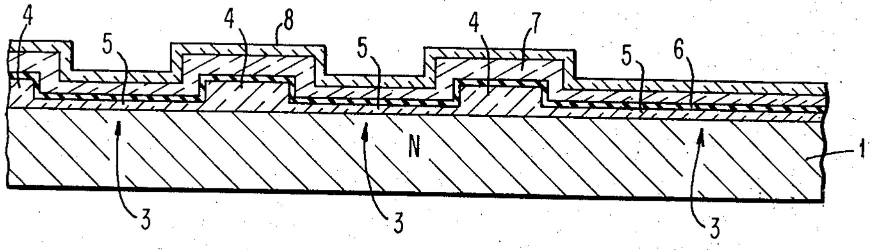

Thereafter, as shown in FIG. 7, in the next step, layer 7 of polycrystalline silicon is covered with a layer 8 of thermally grown silicon dioxide approximately 1000 A. thick in a manner similar to the manner in which layer 2 and thin oxide regions 5 were formed in FIGS. 2, 4, respectively.

Figure 8:
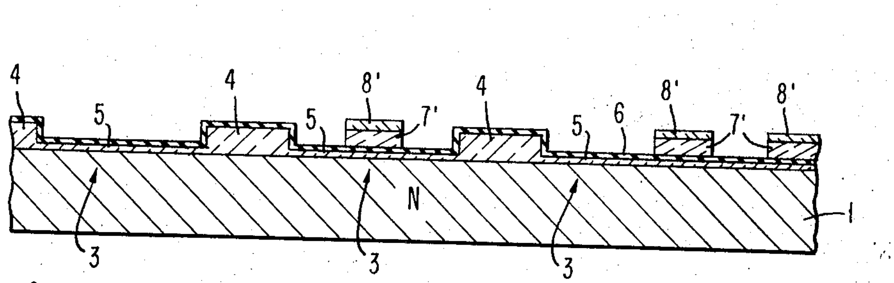
Figure 14:
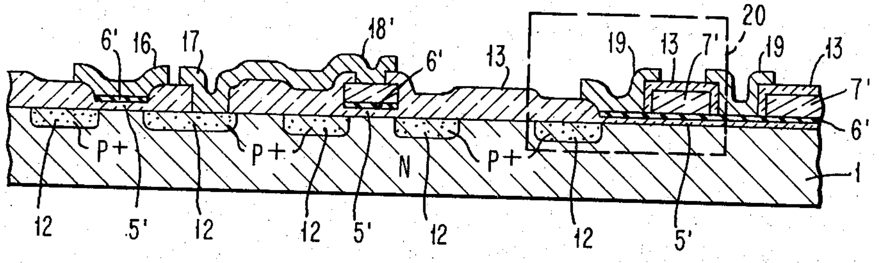
FIG. 14 is a cross sectional view of a semiconductor wafer showing a semiconductor having at least three thin oxide regions covered with silicon nitride into which a self-aligned silicon gate, a metal gate, and a plurality of silicon gates and metal gates spaced from one another by oxide insulation have been fabricated to form a silicon gate FET, a metal gate FET and a charge coupled shift register arrangement.

In FIG. 8, large portions of polycrystalline layer 7 and thermally grown oxide layer 8 have been removed leaving islands 7′ covered with masking portions 8′ of thermally grown silicon dioxide layer 8. The removal of large portions of layer 7, 8 is accomplished by first delineating silicon dioxide portions 8′ using well-known photolithographic and etching techniques briefly mentioned hereinabove and well known to those skilled in the semiconductor arts. Briefly, after a commercially available photoresist is exposed, developed, and the exposed portions removed after a second masking step, an etchant for silicon dioxide is applied to the exposed surface portions of layer 8. The etchant removes the silicon dioxide layer 8 everywhere except where protected by the undeveloped photoresist pattern. Upon reaching layer 7, another suitable etchant such as a hot mixture of ethylene diamine, pyrocatechol, and water, is utilized to remove all of polycrystalline layer 7 except those portions 7′ which are underneath silicon dioxide portions 8′; the latter, at this point, acting as an etch mask and resulting in polycrystalline portions 7′. Because the etchant for the polycrystalline silicon does not attack the underlying layer 6 of silicon nitride, this etching process is essentially self-limiting once the desired portions of polycrystalline layer 7 has been removed. At this point, the remaining portions 8′ of silicon dioxide layer 8 are removed leaving only exposed portions of silicon nitride layer 6 and portions 7′ of polycrystalline layer 7 which, as will be seen, form the self-aligned silicon gates of the devices ultimately formed and as shown in FIG. 14 hereinbelow. Portions 8′ of silicon dioxide are removed in a dip etching step using an etchant such as the etchant referred to in connection with FIG. 3, which neither attacks the underlying polysilicon portions 7′ nor the exposed surface portion of silicon nitride layer 6.

After the second masking step, a layer 9 of chemically vapor deposited silicon dioxide approximately 1000 A. thick is deposited on the exposed portions of silicon nitride layer 6 and on polysilicon regions 7′. Layer 9 is chemically vapor deposited from an orthosilicate system in which tetraethylorthosilicate is decomposed in oxygen at a temperature of 450° C. to form a layer of silicon dioxide. Layer 9 is then densified by baking at 1000° C. Because thermally grown silicon dioxide does not easily form on silicon nitride, even though it does form on polycrystalline silicon, the expedient of chemically vapor depositing silicon dioxide layer 9 is utilized to insure deposition on nitride layer 6 and to have present a material which is capable of acting, when suitably delineated, as a mask for portions of underlying silicon nitride layer 6. This third masking step is carried out and shown in FIG. 9.

Figure 9:
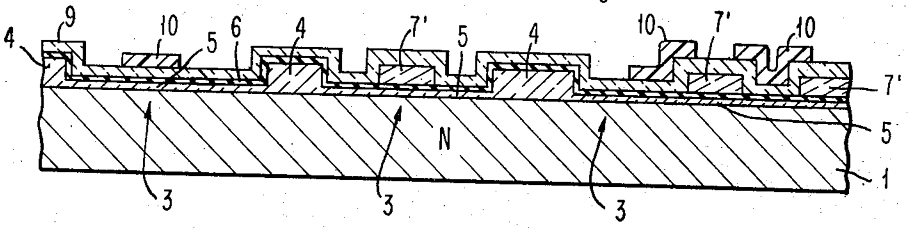

The masking step utilized in FIG. 9 exposes a photoresist in the usual way through a mask which permits the exposure of certain areas such that, when the photoresist is developed and the unexposed areas removed, photoresist portions 10 remain. Resist portions 10 protect underlying portions of chemically vapor deposited silicon dioxde layer 9 leaving other portions of it exposed. The exposed portions of layer 9 are then etched in a buffered etch for silicon dioxide removing the exposed portions of silicon dioxide layer 9 down to silicon nitride layer 6 and polycrystalline silicon layer 7'. At this point, all of silicon dioxide layer 9 is removed except for those regions under photoresist 10. Photoresist portions 10 are then stripped and the portions 9' of oxide layer 9 which act as masks to protect the underlying silicon nitride during a nitride removal step discussed in connection with FIG. 10.

While the chemically vapor deposited layer 9 after suitable delineation is the preferred approach in masking portions of silicon nitride layer 6, it should be appreciated that photoresist alone can be directly applied atop layer 6 and over polycrystalline regions 7' and exposed and delineated in the usual way. Thus, photoresist masking regions 10 in FIG. 9 in the absence of deposited oxide layer 9 would have the same shape as shown except they would be disposed directly on portions of layer 6 standing alone or on portions of layer 6 adjacent polycrystalline regions 7' where masking is desired.

Figure 10:
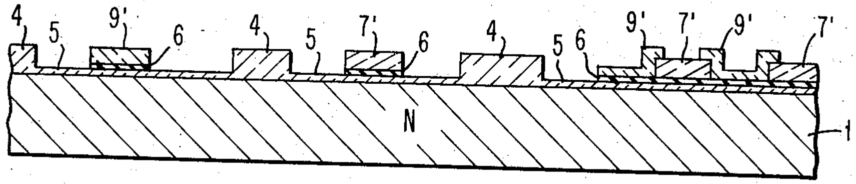

The structure of FIG. 10 results from the exposure of the unmasked portions of silicon nitride layer 6 to hot phosphoric acid which does not appreciably attack the masking oxide portions 9'. In FIG. 10, it should be appreciated that polycrystalline portions 7' also act as masks for the portions of silicon nitride layer 6 which they cover.

From FIG. 10 it may be seen that portions of thin oxide regions 5 are now exposed except where silicon nitride layer 6 is masked by portions 9' of chemically vapor deposited silicon dioxide layer 9 or by portions 7' of polycrystalline silicon. At this point, the exposed thin oxide portions 5 and portions 9' of oxide layer 9 are removed in a dip etch of a buffered solution of hydrofluoric acid and ammonium or fluoride which does not attack either silicon nitride or polycrystalline silicon and is controlled in time so as to reduce thick oxide regions 4 by only a fracton of its thickness. After exposure to the above mentioned etchant, portions of the silicon surface in channel regions 3 are exposed except where the channel regions are masked by an overlying silicon nitride or polycrystalline silicon mask. The structure after the dip etch to remove oxide portions 9' and after the removal of portions of thin oxide 5 is shown in FIG. 11.

Where a photoresist alone is used to mask portions of nitride layer 6, exposed portions of that layer are removed by etching in a buffered hydrofluoric acid-ammonium bifluoride etchant for a suitable time. After stripping of the photoresist, wafer 1 is dip etched to remove the exposed portions of thin oxide layer 5 and provides the same structure as shown in FIG. 11 as is obtained using deposited oxide masking portions.

Figure 11:
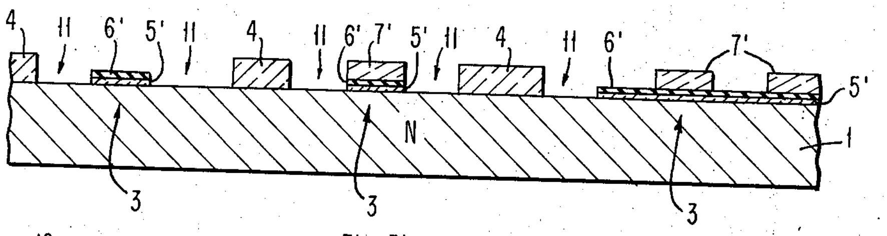

In FIG. 11, the remaining thin oxide portions are designated as 5', the remaining nitride portions are designated as 6', and the polycrystalline silicon gates portions are designated 7'. In this way, windows 11 into which P+ diffusions are to be made are delineated.

Figure 12:
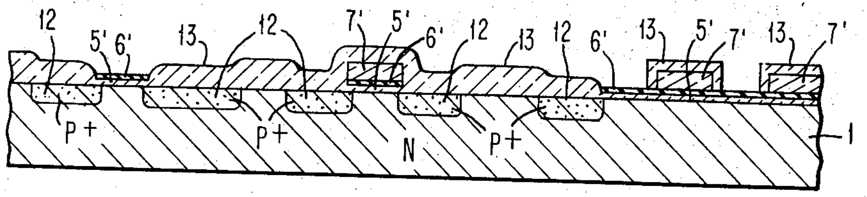

FIG. 12 shows the results of diffusing a P-type dopant via windows 11 into semiconductor wafer 1 forming diffusions 12. The diffusion technique is one well known to those skilled in the semiconductor fabrication arts and consists in the deposition from a vapor of an appropriate dopant such as boron as a thin layer over windows 11. Following the boron deposition, a drive-in step which consists of heating wafer 1 to a temperature of 1000° C. for a time sufficient to obtain a desired diffusion depth is carried out. Once diffusions 12 have been obtained, wafer 1 is again thermally oxidized to form a coating 13 of silicon dioxide everywhere except where silicon nitride portions 6' are exposed. Wafer 1 is thermally oxidized for a time sufficient to form a layer of silicon dioxide approximately 4000 Angstroms thick over diffused regions 12 and polysilicon portions 7'. At this point, it should be appreciated that exposed silicon nitride portions 6', prevent the formation of oxide thereon during the thermal oxidation step providing, in the instance of the leftmost nitride portion 6' in FIG. 12, a self-aligned channel region into which a metal gate may be formed.

Figure 13:
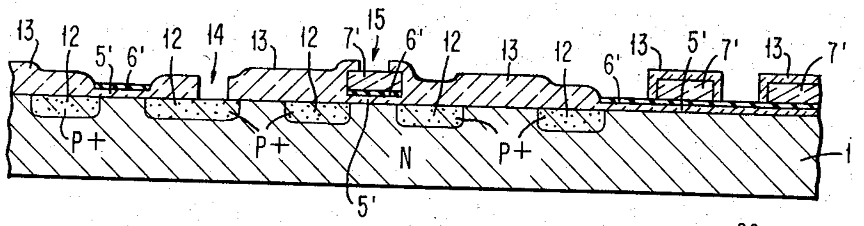

In a fourth masking step, as shown in FIG. 13, contact holes 14, 15 to diffused regions 12 or to polycrystalline silicon regions 7', respectively, are opened up by a standard photolithographic masking and etching step similar to those indicated hereinabove as required by the details of the integrated circuit being fabricated.

In a fifth and final masking step, a metal such as aluminum is deposited everywhere over the surfaces of silicon dioxide layer 13, nitride portions 6', and in contact holes 14, 15 which contact a diffusion 12, and a polycrystalline silicon portion 7', respectively. The aluminum layer is then delineated by a photolithographic masking and etching step similar to those indicated hereinabove forming, an aluminum gate 16 on silicon nitride portion 6' which delineates a self-aligned channel between two P+ diffusions 12; a contact 17 in hole 14 contacting diffusion 12; a gate contact 18 in hole 15 to polycrystalline silicon region 7' which ,in FIG. 14, can now be seen as a self-aligned silicon gate between two P+ diffusions 12 and, metal gates 19, one of which is disposed adjacent a diffusion 12 which is disposed under a thick oxide and adjacent to and insulated from a polycrystalline silicon portion 7' which now can be seen to be a polycrystalline silicon gate for a charge coupled device. In FIG. 14 another metal gate 19 is shown disposed between and insulated from polycrystalline regions 7' by oxide 13. Approximately 12,000 Angstroms of aluminum are deposited prior to delineation.

In FIG. 14, it can be seen that three different devices have been formed using the process steps described hereinabove along with five masks. The devices are a metal gate field-effect transistor with a self-aligned thin oxide-nitride region under metal gate 16, a self-aligned silicon gate field-effect transistor and a charge coupled device incorporating both metal and silicon gates. It should be appreciated, at this point, that utilizing one more masking step than that shown in the prior art, devices having aluminum and polycrystalline gates can be formed on the same chips providing a flexibility and level of performance heretofore not possible in the prior art. Both types of gates are over a thin composite gate insulator of silicon nitride and silicon dioxide of the same thickness, while relatively thick oxides have been provided to isolate the aluminum layer from either the diffused regions or the polysilicon regions.

While the fabrication process described hereinabove has discussed P-channel devices, it should be appreciated that the same fabrication technique can be applied in connection with N-channel devices. Also, while only one each of the possible devices obtained by the present process has been indicated, it should be appreciated that a plurality of such devices can be fabricated simultaneously on a single semiconductor wafer. Also, in connection with the charge coupled device shown in FIG. 14, it should be appreciated that where a shift register embodiment is utilized another diffusion 12 is included having a channel region 5' disposed between pairs of diffusion 12 over which polysilicon gates 7' and metal gates 19 step charge from one of the pairs of diffusions to the other of the pairs of diffusions 12. Where a random access cell is utilized only a single diffusion is required since charge is shifted into a storage well from a diffusion and shifted out from a storage well via the same diffusion. This arrangement is shown within dotted box 20 in FIG. 14 and is more specifically described in connection with FIG. 15.

Figure 15:
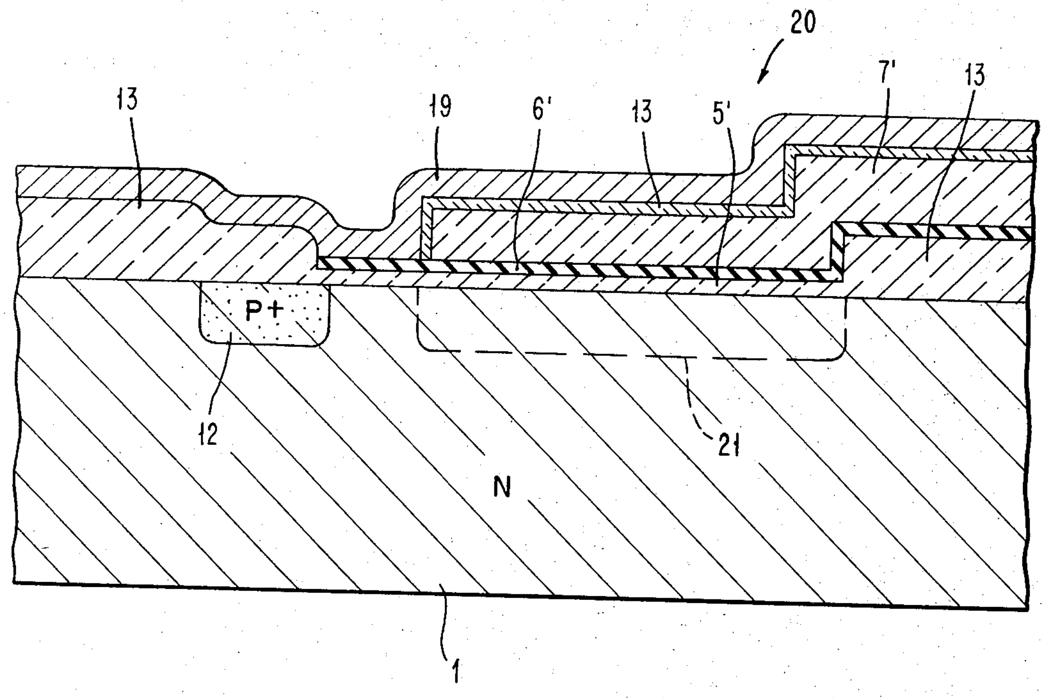
FIG. 15 is a cross sectional view of a charged coupled device random access cell in which a metal word line is fabricated immediately adjacent a diffused bit line which is disposed under a thick oxide. In the random access cell, polysilicon is used as a storage plate.

FIG. 15 shows an aluminum-silicon self-aligned gate charge coupled device random access cell which is formed using the process steps described above in conjunction with FIGS. 1–14. The arrangement shown differs from other charge coupled device cells in that the metal word line 19 of the device is disposed immediately adjacent a P+ diffusion 12 which, in the charge coupled device regime, is a diffused bit line. Metal word line 19 is disposed on a silicon nitride portion 6' which in turn is disposed on a thin oxide region 5'. Thick oxide portions 13 are disposed over diffusion 12 and between a polysilicon storage plate 7' where the extension of plate 7' is desired to have no effect in forming a potential well within semiconductor wafer 1. By applying an appropriate potential to polysilicon storage plate 7', the potential well shown by dashed line 21 in FIG. 15 is formed. Using this arrangement, information in the form of charge is introduced into potential well 21 from diffused bit line 12 via metal word line 19 when these electrodes are appropriately activated. Conversely, charge in potential well 21 is transferred from potential well 21 via a channel formed by metal word lines 19 to diffusion 12 when these electrodes are appropriately activated in a manner well known to those skilled in the charge coupled device art. In FIG. 15, it should be noted that metal word line 19 and polysilicon storage plate 7' are insulated from each other by an oxide layer 13. The charge coupled random access cell of FIG. 15 has a self-aligned channel region into which metal word line 19 can be deposited. Under such circumstances, moderate misalignment of the metal mask can be tolerated because the channel region is self-aligned. Also, this device requires no contact hole formation.

From the foregoing, it should be clear that a five mask semiconductor fabrication process has been described in which the novel order of the fabrication steps permits the formation of three different types of devices on the same semiconductor wafer. Thus, while polysilicon self-aligned gate field-effect transistors and metal gate field-effect transistors are separately known in the prior art, no similar process for simultaneously forming such devices in such a simple way is known. In addition, while the fabrication of charge coupled devices by itself is known, no process similar to that described hereinabove is known which will simultaneously provide metal gate, silicon self-aligned gate field-effect transistors and charge coupled devices. The simultaneous fabrication of the three devices or a random access cell alone or any combination of these devices is made possible by the use of chemically vapor deposited oxide or resist atop a silicon nitride layer which is used to mask the silicon nitride during an etching step. Having been delineated the chemically vapor deposited oxide or resist is utilized as a mask for the removal of desired portions of silicon nitride. The remaining nitride in conjunction with polycrystalline silicon regions, acts as a diffusion mask during the diffusion of source and drain regions in a semiconductor. Finally, the nitride after acting as a diffusion mask prevents the formation of a final thermally grown oxide thereby providing self-aligned channel regions into which metallization may be formed.

While only a rather general metallization and contact forming technique has been shown, it should be appreciated that the process for forming both silicon and metal gates which results in the devices indicated provides, when combined with the metallization step, a flexibility for interconnections not heretofore available particularly in the random access arrangement of FIG. 15. The random access device described in connection with FIG. 15 has thin insulating regions 5', 6' under both polycrystalline silicon and metal gate regions with the layer disposed immediately adjacent to diffusion 12 being able to cross over diffusion 12 to provide word lines orthogonal to the bit lines, as required for random access arrays, with no contact holes needed in the array area.

In connection with FIGS. 1–15, it should be noted that, for purposes of clear illustration, the drawings have not been made to scale. This should present no difficulty to those skilled in the semiconductor art, since dimensions have been provided for the various layers and regions.

While the invention has been particularly shown and described with reference to preferred embodiments and method steps, it will be understood by those skilled in the art that the foregoing and other changes in form and details may be made therein without departing from tne spirit and scope of the invention.

What is claimed is:

1. In a process for fabricating semiconductor devices wherein a semiconductor wafer has a plurality of thin insulating material regions formed in a thick insulating layer disposed on the surface of said wafer said insulating layer being covered with a layer of different insulation from said first mentioned insulating layer and the former being covered with a layer of semiconductor the steps of:

forming in certain of said different insulation covered thin insulating material regions at least a single delineated semiconductor region, forming in certain other of said different insulation covered thin insulating material regions and adjacent certain of said at least a single delineated semiconductor region masking regions to protect regions of said different insulation, etching said different insulation to remove it everywhere except under said delineated semiconductor regions and said masking regions to provide a plurality of exposed thin insulating material regions, and etching said exposed thin insulating material regions to provide a plurality of exposed semiconductor surface regions and a plurality of exposed regions of said different insulation the latter insulation and said semiconductor regions masking other semiconductor surface regions.

2. In a process for fabricating semiconductor devices according to claim 1 wherein the step of forming at least a single delineated semiconductor region includes the steps of:

thermally oxidizing said layer of semiconductor to form a semiconductor oxide layer, photolithographically masking said semiconductor oxide layer to provide masking elements of photoresist on said oxide layer, and etching said oxide layer and said semiconductor layer down to said layer of different insulation.

3. In a process for fabricating semiconductor devices according to claim 1 wherein the step of forming masking regions includes the steps of:

photolithographically masking said layer of different insulation to provide masking elements of photoresist on said layer of different insulation, etching said layer of different insulation down to said thin insulating material and, stripping said masking elements of photoresist.

4. In a process for fabricating semiconductor devices according to claim 1 wherein the step of etching said exposed thin insulating material includes the step of:

immersing said semiconductor in an etchant to remove said thin insulating and deposited masking regions.

5. In a process for fabricating semiconductor devices according to claim 1 wherein said semiconductor wafer is single crystal silicon.

6. In a process for fabricating semiconductor devices according to claim 1 wherein said thin insulating material regions and said thick insulating layer are silicon dioxide.

7. In a process for fabricating semiconductor devices according to claim 1 wherein said delineated semiconductor regions are polycrystalline silicon.

8. In a process for fabricating semiconductor devices according to claim 1 wherein said layer of different insulation is silicon nitride.

9. In a process for fabricating semiconductor devices according to claim 1 wherein the step of forming masking regions includes the steps of:

forming deposited insulating material masking regions.

10. In a process for fabricating semiconductor devices according to claim 9 wherein said deposited insulating material masking regions are made of chemically vapor deposited silicon dioxide.

11. In a process for fabricating semiconductor devices according to claim 9 wherein the step of forming deposited insulating material masking regions includes the step of:

decomposing a semiconductor oxide containing compound to deposit a layer of semiconductor oxide on said exposed regions of said different insulation and on said at least a single delineated semiconductor region, heating to densify said deposited layer of semiconductor oxide, photolithographically masking said layer of deposited semiconductor oxide to provide masking elements of photoresist on said layer of semiconductor oxide, etching said semiconductor oxide down to said layer of different insulation, and stripping said masking elements of photoresist.

12. In a process for fabricating semiconductor devices wherein a semiconductor wafer has a plurality of thin insulating material regions formed in a thick insulating layer disposed on the surface of said wafer said insulating layer being covered with a layer of different insulation from said first mentioned insulating layer and the former being covered with a layer of semiconductor the steps of:

forming in said different insulation covered thin insulating material regions a delineated semiconductor region, forming adjacent said delineated semiconductor region a masking region to provide an exposed region of said different insulation, etching said thus exposed region of said different insulation to remove it except under said delineated semiconductor region and said masking region to provide an exposed thin insulating material region, and etching said exposed thin insulating material region to provide an exposed semiconductor surface region and an exposed region of said different insulation the latter and said semiconductor regions masking other semiconductor surface regions.

13. In a process for fabricating semiconductor devices according to claim 12 wherein the step of forming a delineated semiconductor region includes the steps of:

thermally oxidizing said layer of semiconductor to form a semiconductor oxide layer, photolithographically masking said semiconductor oxide layer to provide masking elements of photoresist on said oxide layer, and etching said oxide layer and said semiconductor layer down to said layer of different insulation.

14. In a process for fabricating semiconductor devices according to claim 12 wherein the step of forming a masking region includes the steps of:

photolithographically masking said layer of different insulation to provide masking elements of photoresist on said layer of different insulation, etching said layer of different insulation down to said thin insulating material, and stripping said masking elements of photoresist.

15. In a process for fabricating semiconductor devices according to claim 12 wherein the step of etching said exposed thin insulating material includes the step of:

immersing said semiconductor in an etchant to remove said thin insulating region.

16. In a process for fabricating semiconductor devices according to claim 12 wherein said thin insulating material regions and said thick insulating layer are silicon dioxide.

17. In a process for fabricating semiconductor devices according to claim 12 wherein said semiconductor is single crystal silicon.

18. In a process for fabricating semiconductor devices according to claim 12 wherein said delineated semiconductor regions are polycrystalline silicon.

19. In a process for fabricating semiconductor devices according to claim 12 wherein said layer of different insulation is silicon nitride.

20. In a process for fabricating semiconductor devices according to claim 12 wherein the step of forming masking regions includes the steps of:

forming deposited insulating material masking regions.

21. In a process for fabricating semiconductor devices according to claim 20 wherein the step of forming a deposited insulating material masking region includes the steps of:

decomposing a semiconductor oxide containing compound to deposit a layer of semiconductor oxide on said exposed region of said different insulation and on said delineated semiconductor region, photolithographically masking said layer of semiconductor oxide to provide a masking element of photoresist on said layer of semiconductor oxide, etching said semiconductor oxide down to said layer of different insulation, and stripping said masking element of photoresist.

22. In a process for fabricating semiconductor devices according to claim 20 wherein said deposited insulating material masking region is made of chemically vapor deposited silicon dioxide.

References Cited

UNITED STATES PATENTS 3,607,480 9/1971 Harrap .............. 156—17
3,713,911 1/1973 Larkin et al. ........ 156—17 X WILLIAM A. POWELL, Primary Examiner U.S. Cl. X.R.

29—576; 156—17; 317—235